(12) United States Patent
Oberdieck et al.

(10) Patent No.: US 11,962,291 B2
(45) Date of Patent: Apr. 16, 2024

(54) DRIVER CIRCUIT FOR A LOW INDUCTIVE POWER MODULE AND A LOW INDUCTIVE POWER MODULE WITH ENHANCED SHORT CIRCUIT WITHSTAND CAPABILITY

(71) Applicant: Robert Bosch GmbH, Stuttgart (DE)

(72) Inventors: Karl Oberdieck, Neckartenzlingen (DE); Christian Maier, Reutlingen (DE); Sebastian Strache, Wannweil (DE)

(73) Assignee: ROBERT BOSCH GMBH, Stuttgart (DE)

( * ) Notice: Subject to any disclaimer, the term of this patent is extended or adjusted under 35 U.S.C. 154(b) by 0 days.

(21) Appl. No.: 17/908,635

(22) PCT Filed: Mar. 4, 2021

(86) PCT No.: PCT/EP2021/055488
§ 371 (c)(1),
(2) Date: Sep. 1, 2022

(87) PCT Pub. No.: WO2021/176003
PCT Pub. Date: Sep. 10, 2021

(65) Prior Publication Data
US 2023/0126070 A1   Apr. 27, 2023

(30) Foreign Application Priority Data
Mar. 5, 2020   (DE) .............. 10 2020 202 842.7

(51) Int. Cl.
*H03K 17/082* (2006.01)
*H03K 3/012* (2006.01)

(52) U.S. Cl.
CPC ......... *H03K 17/0822* (2013.01); *H03K 3/012* (2013.01); *H03K 2217/0081* (2013.01)

(58) Field of Classification Search
CPC .............. H03K 17/0822; H03K 3/012; H03K 2217/0081
See application file for complete search history.

(56) References Cited

U.S. PATENT DOCUMENTS 9,490,798 B1   11/2016   Charpentier et al.
10,193,544 B2   1/2019   Bhat et al.
(Continued)

FOREIGN PATENT DOCUMENTS

EP   1988632 A1   11/2008
EP   2999118 A1   3/2016
(Continued)

OTHER PUBLICATIONS

International Search Report for PCT/EP2021/055488 dated May 26, 2021.

*Primary Examiner* — Sibin Chen
(74) *Attorney, Agent, or Firm* — NORTON ROSE FULBRIGHT US LLP; Gerard A. Messina

(57) ABSTRACT

A driver circuit for a low-inductance power module that has a connection and an output. The connection is connectable to the source contact of a power transistor and the output is connectable to the gate contact of the power transistor. The driver circuit is configured to produce, in a first operating mode, a first gate-source voltage for the gate contact of the power transistor and to provide the first gate-source voltage at the output of the driver circuit. The driver circuit is also configured to produce, in a second operating mode, during at least one preset minimum time span, a lower second gate-source voltage for the gate contact of the power transistor and to provide the second gate-source voltage at the output of the driver circuit.

10 Claims, 3 Drawing Sheets

(56) References Cited

U.S. PATENT DOCUMENTS

| | | | | |
|---|---|---|---|---|
| 2015/0003133 | A1* | 1/2015 | Ogawa | H03K 17/16 |
| | | | | 327/384 |
| 2016/0182034 | A1* | 6/2016 | Wagoner | H03K 17/166 |
| | | | | 327/432 |
| 2018/0013416 | A1* | 1/2018 | Sicard | H01L 29/7393 |
| 2019/0267793 | A1* | 8/2019 | Hematy | H02H 3/243 |
| 2020/0144997 | A1* | 5/2020 | Charpentier | H03K 3/012 |

FOREIGN PATENT DOCUMENTS

| | | |
|---|---|---|
| EP | 3035532 A1 | 6/2016 |
| JP | 2004312796 A | 11/2004 |
| JP | 2007174134 A | 7/2007 |
| JP | 2009071956 A | 4/2009 |
| JP | 2010124627 A | 6/2010 |
| JP | 2012217087 A | 11/2012 |
| JP | 2012222932 A | 11/2012 |
| JP | 2017103879 A | 6/2017 |

\* cited by examiner

DRIVER CIRCUIT FOR A LOW INDUCTIVE POWER MODULE AND A LOW INDUCTIVE POWER MODULE WITH ENHANCED SHORT CIRCUIT WITHSTAND CAPABILITY

FIELD

The present invention relates to a driver circuit for a low-inductance power module that has a connection and an output, the connection being connectable to the source contact of a power transistor and the output being connectable to the gate contact of the power transistor. The driver circuit is designed to produce, in a first operating mode, a first gate-source voltage for the gate contact of the power transistor and to provide said first voltage at the output of the driver circuit.

BACKGROUND INFORMATION

Low-inductance power modules, in particular power modules that use semiconductors having wide band gaps, such as silicon carbide MOSFETs (SiC MOSFETs), offer—for example when compared with other switching means—significant advantages in the area of switching losses, which contributes to, inter alia, larger ranges of electric vehicles. In order to enable superior switching power levels with large switchable voltages (du/dt>10V/ns) and large switchable currents (di/dt>1 A/ns), modules having low inductance (L<15 nH) are required for the stated power modules.

In order to achieve the above-mentioned superior switching power, the power modules under consideration here are mostly provided on thin chips, which—compared to other power modules provided on thicker chips—have a lower thermal capacity, which reduces the time span during which the power modules can withstand a short circuit. Here, in particular two different so-called short circuit types, or short circuit conditions, play an important role.

In the so-called short circuit type 1, a short circuit occurs directly in, or during, the switch-on process of the power module, in particular a power transistor, while in the so-called short circuit type 2 a short circuit occurs after the switch-on process of the power module or power transistor. Thus, the increased switching power described above is critical in particular with regard to short circuit type 1, because for example a power transistor such as a power MOSFET, in the case of a short circuit of type 1, is switched on with a higher gate-source voltage $U_{GS}$ and is operated with a very high drain-source voltage $U_{DS}$. This can happen for example when the complementary partner of the short-circuited power MOSFET (for example inside an inverter circuit) is damaged. In such a case, a short circuit monitoring circuit connected to the power module or power transistor, which in the case of a monitoring circuit of the voltage over a power transistor is often referred to as a desaturation detection circuit (DeSat), has to recognize that there is a short circuit and has to switch off the power module or power transistor. The monitoring circuit described above reacts to the semiconductor voltage, and is therefore switched ineffective in the switching moment, the so-called blanking time. In addition to this blanking time, there is a reaction time in which the short-circuited power semiconductors are switched off. This blanking and reaction time must not exceed the maximum time period within which the power module, or power transistor, is still capable of withstanding a short circuit before failing.

Due to the above-described short current rise time period at the above-described superior switching power, i.e., due to the fast rise in current, during the above-described blanking and reaction time there is a significant excess current, in which currents flow that are ten times as large as the nominal current. This excess current causes significant heating of the power module or power transistor, causing additional degradation of the power module/power transistor, which shortens the above-described maximum time period during which the power transistor is still capable of withstanding a short circuit.

In the so-called short circuit type 2, a short circuit occurs while the power module or power transistor is already in the (fully) switched-on state. This can happen for example when the complementary partner of a short-circuited power MOSFET (for example in an inverter circuit) in the switched-on state is damaged. After a fault of the power module/power transistor, for example after a failure of the complementary switching transistor, first the current di/dt flowing through the power transistor increases, and then the voltage prevailing therein increases.

Due to a displacement current that arises during the increase in the transistor voltage du/dt, the gate-source voltage $U_{GS}$ of the power transistor increases beyond the normal switch-on value. The increase in the gate-source voltage $U_{GS}$ beyond the normal switch-on value increases the short circuit current still further. A short circuit monitoring circuit (see above: desaturation detection circuit (DeSat)), or a switch-off circuit that measures the change in current di/dt over time using an auxiliary inductor, triggers the process of switching off the power transistor. However, the short circuit monitoring circuit is not capable of reducing the load (in particular when there are current peaks) of the power module/power transistor during such faults. Such loads, in particular stresses inside the power module/power transistor, can cause degradation of the parameters of this power module/power transistor.

In the related art, there are various methods or circuit variants for prolonging the above-described maximum withstanding time period during which the power module or power transistor is capable of withstanding a short circuit without being destroyed. Here, for example conventional methods such as gate-source feedback or providing a higher gate resistance cause a reduction in the switching power of the power module/power transistor, and thus increase the switching energy. Further methods of this sort are described, for example, in U.S. Pat. No. 9,490,798 B1 and in U.S. Pat. No. 10,193,544 B2.

SUMMARY

According to the present invention, a driver circuit, having a connection and an output, is provided for a low-inductance power module. According to an example embodiment of the present invention, the connection is connectable to the source contact of a power transistor and the output is connectable to the gate contact of the power transistor. The driver circuit is designed to produce, in a first operating mode, a first gate-source voltage for the gate contact of the power transistor and to provide this first voltage at the output of the driver circuit. According to the present invention, the driver circuit is in addition designed to produce, in a second operating mode, during at least one preset minimum time span, a lower second gate-source voltage for the gate contact of the power transistor, and to provide this second voltage at the output of the driver circuit.

With such a driver circuit, it is advantageously possible to effectively protect the power module or the power transistor from damage due to a short circuit, in both short circuit cases 1 and 2 described above, while the switching behavior remains the same, i.e., the switching power or switching efficiency remains the same, with the known low power losses. This is done in that the driver circuit permits operation of the power module/power transistor in two different operating modes with two different gate-source voltages. For protection against short circuits of type 1, the current peak in the power module/power transistor (which arises during the short circuit) is lowered through a reduction of the gate-source voltage in a time span during the short circuit detection time (i.e. during a few microseconds) of the short circuit monitoring circuit, or short circuit recognition circuit (DeSat), in the second operating mode. Due to this lowering of the gate-source voltage, the saturation current of the power module/power transistor in the output characteristic curves (i.e. the current $I_D=f(U_{DS})$, i.e., the drain current $I_D$ as a function of the drain source voltage) is reduced. After the elapsing of the preset minimum time span, the driver circuit, in the first operating mode, increases the gate-source voltage from the second to the first gate-source voltage, and provides this at the output of the driver circuit for the gate contact of a power transistor connected to the output of the driver circuit. After the elapsing of the preset minimum time span, the nominal gate-source voltage of the power transistor is thus (again) produced or generated inside the driver circuit and provided at the output of the driver circuit. This enables the known advantageous operation of the power transistor with low power losses, which occurs in particular given the use of SiC MOSFETs, with simultaneously improved short-circuit protection. The increased power loss energy during the reduction of the gate-source voltage in the second operating mode can be calculated as follows:

$$\Delta J_{cond}=(R_{DSon}u_{GS1}-R_{DSon}u_{GS2})*I_D^2*tu_{GS1}$$

$$\Delta J_{cond}=U_{DS}*I_D*tU_{GS1},$$

where $\Delta J_{cond}$ is the change in the power loss energy, $R_{DSon}u_{GS1}$ is the on-state resistance of the drain-source path of the power transistor with the first gate-source voltage in the first operating mode, $R_{DSon}u_{GS2}$ is the on-state resistance of the drain-source path of the power transistor with the second gate-source voltage in the second operating mode, $I_D$ is the drain current of the power transistor, and $tu_{GS1}$ is the preset minimum time span. It is to be noted that the reduced second gate-source voltage still has to be selected to be large enough that a reliable, or normal, switching on of the power transistor remains ensured.

Preferably, the preset minimum time span corresponds to the time span required by a short circuit recognition circuit connected to the power transistor to recognize a short circuit when the power transistor is switched on, and to initiate and/or carry out a switching off of the power transistor. In such an example embodiment, the power module or power transistor, in a state connected to the driver circuit according to the present invention, is particularly well protected against damage or degradation caused by a short circuit.

According to a preferred example embodiment of the present invention, the second operating mode is initiated by the recognition of a switching on of a power transistor connected to the driver circuit.

Preferably, the driver circuit includes two different voltage sources by which the first and the second gate-source voltage can be produced and can be provided at the output of the driver circuit. In this way, the two different gate-source voltages can be provided particularly reliably, and change between them can be done rapidly.

In a preferred specific example embodiment of the present invention, the two different voltage sources each have an input connected to the connection of the driver circuit as well as a respective voltage output, the voltage output of the first voltage source being connected to the output of the driver circuit via a series circuit of a first diode and a first resistor, while the voltage output of the second voltage source is connected to the output of the driver circuit via a parallel circuit of two paths, a diode and/or a resistor being provided in each of the paths. Via the two different voltage outputs, which are each electrically conductively connected to the output of the driver circuit, the gate-source voltages can not only be set up particularly well and accurately, but also monitored.

In some specific example embodiments of the present invention, the gate resistance—compared to the gate resistances in conventional driver circuits, or compared to the gate resistance in a voltage path provided for the provision of the second gate-source voltage in the second operating mode—is preferably reduced, or selected to be lower.

In particular in such specific example embodiments of the present invention, the same switching power, or switching efficiency, can be maintained, particularly compared to a driver circuit by which only one gate-source voltage can be provided. Such a reduced gate resistance also guarantees that when the reduced second gate-source voltage is present there is no delay in switching on the power transistor.

According to an example embodiment of the present invention, preferably, the driver circuit also includes a control circuit that operates the voltage sources corresponding to a predetermined algorithm. Preferably, the control circuit includes a controller, in particular a microcontroller, computer, or a microcomputer. In other variant embodiments according to the present invention, the driver circuit according to the present invention can also include only control means and/or a control connection (and no separate control circuit), which are designed to be controlled by an external control circuit provided outside the driver circuit. Such control means can for example include switching means by which the voltage sources can each be switched into an active or inactive state. Preferably, the control circuit includes a timer circuit. In such an embodiment, the controlling of the voltage sources can advantageously be carried out directly in and by the driver circuit itself. This enables the autonomous use of the driver circuit together with the power module/power transistor.

According to an example embodiment of the present invention, preferably, the control circuit includes an RC switching circuit, or an RC oscillating circuit.

According to an example embodiment of the present invention, preferably, between the output and the connection of the driver circuit there is provided at least one voltage source by which a voltage can be applied to the output of the driver circuit, at least one inductor being reversibly switchable, by a switching means, into the electrical path between the at least one voltage source and the connection. In such a specific embodiment, the driver circuit according to the present invention is particularly well protected against short circuits of type 2. The reversibly switchable inductor acts here as an optional source feedback for a power transistor connected to the driver circuit, which source feedback reduces short circuit current peaks inside the power module/power transistor while the switching power remains the same. Preferably, "reversibly switchable" means that the inductor, in a state of the driver circuit connected to the power module/power transistor, in a first position of the switching means is connected into a feedback loop that connects the source connection of the power transistor, via a voltage source that provides the gate voltage and a gate resistor, to the gate connection of the power transistor, and in a second position of the switching means is coupled out of the feedback loop. In this embodiment, the driver circuit according to the present invention is thus equipped with a selectable source connection. Preferably, the driver circuit is designed to not switch the inductor into the electrical path between the at least one voltage source and the connection during the switch-on process of the power module or of the power transistor. In other words, the driver circuit is preferably designed to couple the inductor out of the electrical path between the at least one voltage source and the connection of the driver circuit during the switch-on process of the power module or of the power transistor. In addition, the driver circuit is preferably designed to switch the inductor into the electrical path between the at least one voltage source and the connection of the driver circuit, i.e. to couple it into this path, after the conclusion of the switch-on process. Preferably, this switching in or out, or the coupling in or out, of the inductor is carried out by the above-described control circuit or by a further control circuit, or by the above-described control means or by further control means, and/or by a control connection. Particularly preferably, this specific embodiment, including a reversibly switchable inductor, can be combined with the previously described specific embodiments.

According to an example embodiment of the present invention, preferably, the driver circuit in addition includes a further voltage source that is connected in series with the inductor, and which can be reversibly switched by the switching means together with the inductor into the electrical path between the at least one voltage source and the connection. In this variant embodiment, the driver circuit is protected in a particularly simple and low-cost manner against short circuits both of type 1 and of type 2, without increasing the switching energies. Further preferably, at least one of the voltage sources of the driver circuit has a linear controller, an RC voltage divider, at least one bipolar transistor, and/or a bootstrap circuit, and/or at least one of the voltage sources of the driver circuit is realized using a bipolar transistor structure and/or a MOSFET structure, in particular as an ASIC, or by discrete components. In this variant embodiment, the driver circuit according to the present invention can be provided in particularly low-cost and/or compact fashion. In such a variant embodiment, the voltage at the gate can be dynamically reproduced, for example by a current source.

In addition, a low-inductance power module having a driver circuit according to the present invention is provided that has a power transistor having a source contact and a gate contact, the source contact being connected to the connection of the driver circuit and the gate contact being connected to the output of the driver circuit. Such power modules have the advantages described above for the driver circuit.

Preferably, the power transistor is a silicon carbide MOSFET. SiC MOSFETs, i.e. silicon carbide MOSFETs, compared for example with other switching means, offer significant advantages in the area of switching power, which contributes, inter alia, to larger ranges for electric vehicles.

Preferably, the terms "connected" and/or "connectable" mean an electrically conductive connection, or an electrically conductive connectability.

Preferably, the preset minimum time span is preset to a value of 2 µs.

Preferably, the preset minimum time span is set to a value of MTS, where MTS∈[0.1 µs; 5 µs].

Advantageous developments of the present invention are disclosed herein.

BRIEF DESCRIPTION OF THE DRAWINGS

Exemplary embodiments of the present invention are explained in more detail on the basis of the figures and the following description.

DETAILED DESCRIPTION OF EXAMPLE EMBODIMENTS

Figure 1:
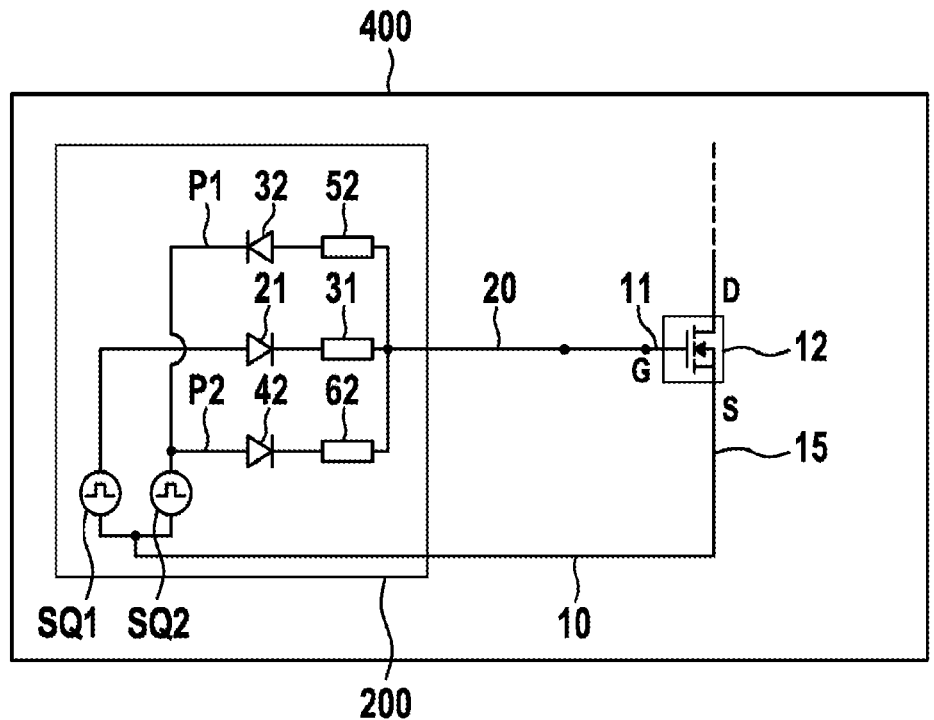
FIG. 1 shows a schematic representation of a first exemplary embodiment of a driver circuit according to the present invention having two voltage sources, in a state connected to a power transistor.

FIG. 1 shows a schematic representation of a first exemplary embodiment of a driver circuit 200 according to the present invention having two voltage sources SQ1, SQ2, in a state connected to a power transistor. This driver circuit 200 according to the present invention is designed for the operation of a low-inductance power module 400, which in this exemplary embodiment is realized, purely as an example, as a silicon carbide power transistor, more precisely purely as an example as a silicon carbide MOSFET. The driver circuit according to the present invention can however also be used for other types of power modules or power transistors. Driver circuit 200 according to the present invention includes a connection 10 and an output 20; in FIG. 1, connection 10 is connected to source contact 15 of a power transistor 12, and output 20 is connected to gate contact 11 of power transistor 12.

Driver circuit 200 according to the present invention is designed to produce, in a first operating mode, a first gate-source voltage $U_{GS1}$ for gate contact 11 of power transistor 12, and to provide said first voltage at output 20 of driver circuit 200. In addition, driver circuit 200 is designed to produce, in a second operating mode, during at least one preset minimum time span, a lower second gate-source voltage $U_{GS2}$ for gate contact 11 of power transistor 12, and to provide said second voltage at output 20 of driver circuit 200. In this exemplary embodiment, a short circuit recognition circuit (not shown in FIG. 1) is connected in electrically conductive fashion to power transistor 12.

In this first exemplary embodiment, the preset minimum time span mentioned above corresponds to the time span required by the short circuit recognition circuit connected to power transistor 12 to recognize a short circuit when power transistor 12 is switched on, and to initiate and carry out a switching off of power transistor 12. The preset minimum time span can however also correspond to the blanking time of the short circuit recognition circuit, and/or can be flexibly coupled to a signal produced by the short circuit recognition circuit, so that the short circuit recognition circuit uses a signal to move the driver circuit into the second operating mode, or initiates this second operating mode.

In this first exemplary embodiment, driver circuit 200 has two different voltage sources SQ1, SQ2 by which first and second gate-source voltage $U_{GS1}$, $U_{GS2}$ can be produced and provided at output 20 of driver circuit 200. However, driver circuits 200 according to the present invention can also be realized that have only one voltage source, or have more than two voltage sources. The two different voltage sources SQ1 and SQ2 each have one input connected to connection 10 of driver circuit 200, and each have one voltage output. In this first exemplary embodiment, the voltage output of first voltage source SQ1 is connected, purely as an example, to output 20 of driver circuit 200 via a series circuit of a first diode 21 and a first resistor 31. In this first exemplary embodiment, purely as an example the voltage output of second voltage source SQ2 is connected to output 20 of driver circuit 200 via a parallel circuit of two paths P1, P2, a diode 32, 42 and a resistor 52, 62 being provided in each of the paths.

In this first exemplary embodiment, driver circuit 200 according to the present invention further includes a control circuit (not shown in FIG. 1) that operates voltage sources SQ1 and SQ2 corresponding to a predetermined algorithm. The algorithm thus operates driver circuit 200 alternately in the first or second operating mode.

Figure 2:
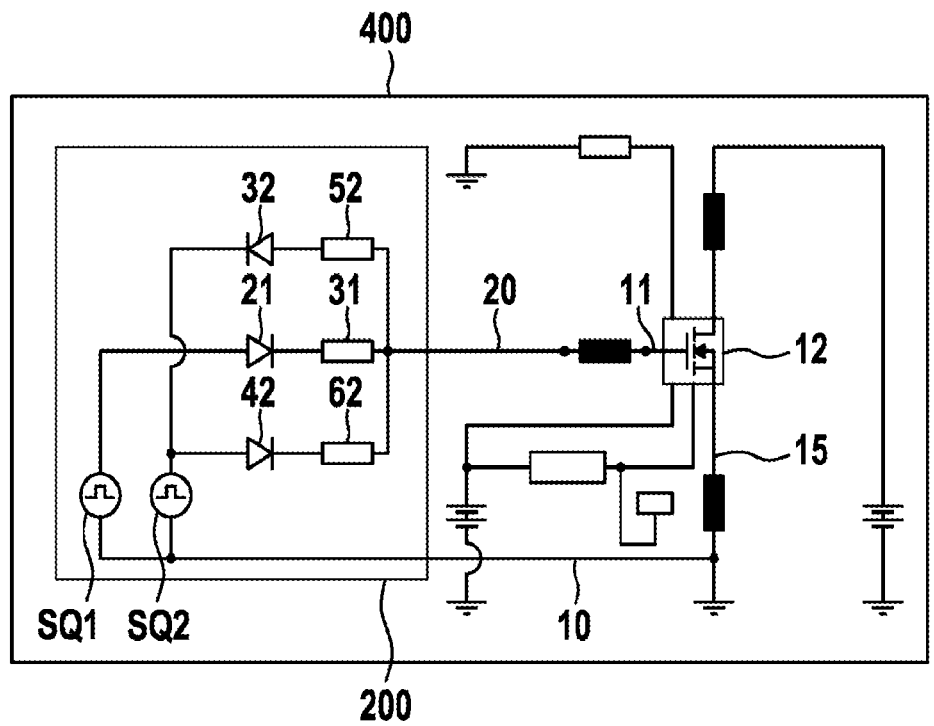
FIG. 2 shows a first application of the first exemplary embodiment of the driver circuit according to the present invention, having a power transistor.

FIG. 2 shows a first application of the first exemplary embodiment of driver circuit 200 according to the present invention having a power transistor 12. In the application shown in FIG. 2, the power module, which here includes, inter alia, driver circuit 200 and the power transistor, also has further electronic components, which however are of no further significance for the technical effect provided by driver circuit 200 according to the present invention. It is important to understand that the goal of the present invention can be achieved in various ways. Thus, the two different gate-source voltages $U_{GS1}$, $U_{GS2}$ can for example be provided by switching on the two voltage sources SQ1 and SQ2 in alternating fashion (i.e., they are not operated or switched on together). The two different gate-source voltages $U_{GS1}$, $U_{GS2}$ can however for example also be provided by a time-delayed switching on of the two voltage sources SQ1 and SQ2, so that first for example second voltage source SQ2 is switched on in order to provide the second gate-source voltage $U_{GS2}$, and after the elapsing of the preset minimum time span the first voltage source SQ1 is additionally switched in order to provide the first gate-source voltage $U_{GS1}$. In this embodiment, the voltages of the two voltage sources SQ1 and SQ2 are thus superposed.

Figure 3:
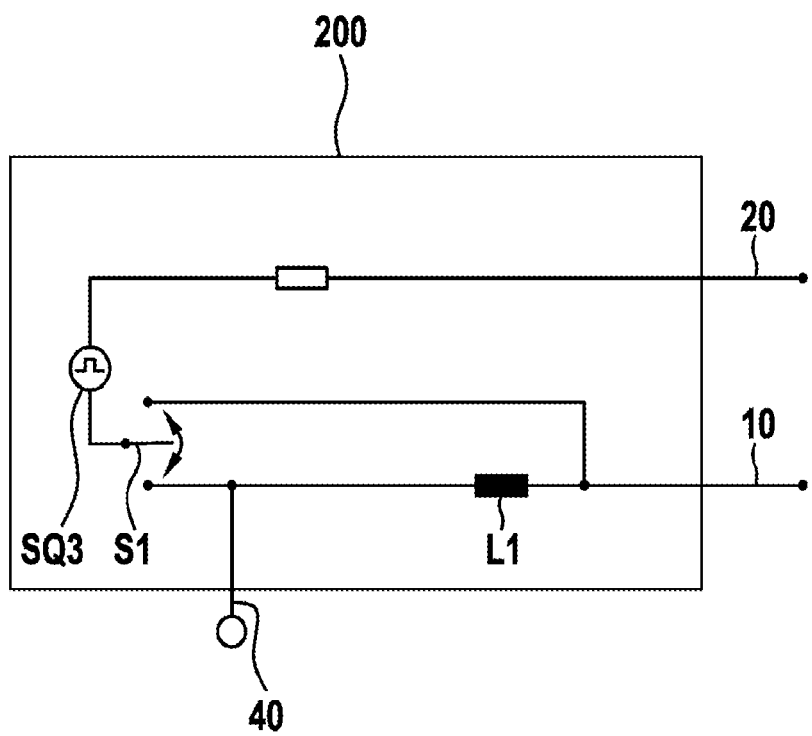
FIG. 3 shows a second exemplary embodiment of a driver circuit according to the present invention, having an inductor that can be coupled.

FIG. 3 shows a second exemplary embodiment of a driver circuit 200 according to the present invention, having an inductor L1 that is capable of being coupled. In this exemplary embodiment, only one voltage source SQ3 is provided between output 20 and connection 10 of driver circuit 200, by which a voltage can be applied to voltage source output 20 of driver circuit 200. In addition, an inductor L1 is reversibly switchable, by a switching means (i.e., switch) S1, to the electric path between the at least one voltage source and connection 10. As explained above, the reversibly switchable inductor here acts as an optional source feedback for a power transistor connected to the driver circuit, which source feedback reduces short circuit current peaks inside the power module/power transistor, while the switching power remains the same. In this second exemplary embodiment, inductor L1 conducts the full load current. In other embodiments, however, it can also conduct a current that is lower than the full load current. By tap 40, which here is a power tap, driver circuit 200, in a state connected to a power module, can be connected to further components, such as a load.

Figure 4:
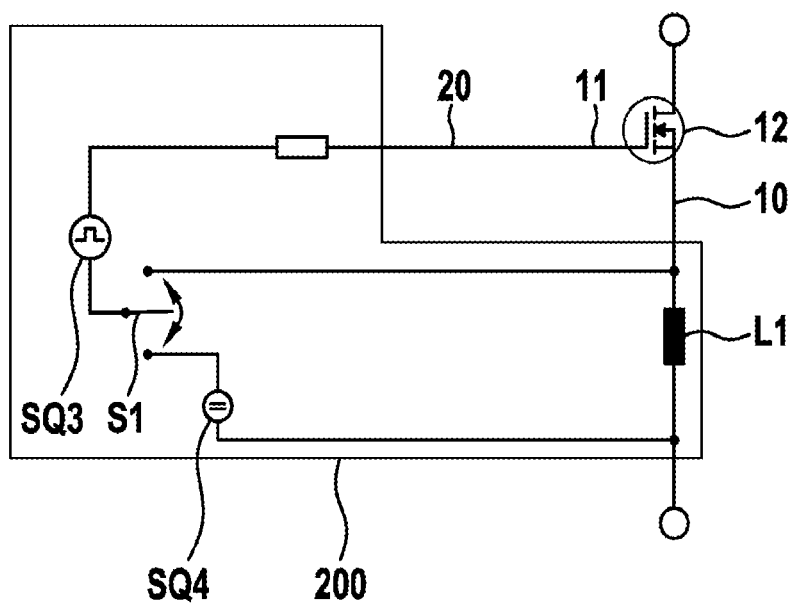
FIG. 4 shows a third exemplary embodiment of a driver circuit according to the present invention.

FIG. 4 shows a third exemplary embodiment of a driver circuit 200 according to the present invention that is largely identical to that shown in FIG. 3, but in addition has a further voltage source SQ4 that is connected in series with inductor L1 and is reversibly switchable, by switching means S1, together with inductor L1 into the electrical path between the at least one voltage source SQ3 and connection 10. In particular in this third embodiment, driver circuit 200 according to the present invention offers efficient protection against both short circuit types 1 and 2. In this third exemplary embodiment as well, inductor L1 conducts, purely as an example, the full load current. However, in other embodiments it can also conduct a current that is lower than the full load current.

Figure 5:
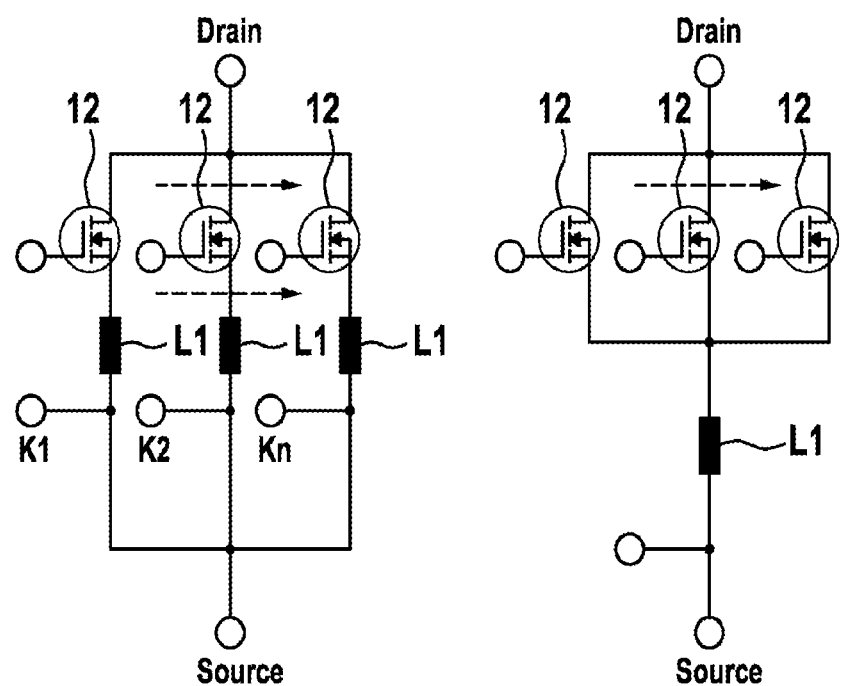
FIG. 5 shows a fourth exemplary embodiment of a driver circuit according to the present invention, having a multiple chip power module.

FIG. 5 shows a part of a fourth exemplary embodiment of a driver circuit 200 according to the present invention having a multiple chip power module. Here, two different circuit variants are shown opposite one another. At left in FIG. 5, a first circuit variant is shown in which each individual chip, or each power transistor 12 realized on such a chip, has its own source feedback. Here, therefore, each individual power transistor 12 realized on a chip has its own inductor L1 that is reversibly switchable into the source path of the respective power transistor 12. In the circuit variant, or circuit configuration, shown at left in FIG. 5, the gate contacts of power transistors 12 in the power module and/or in driver circuit 200 have to be connected to one another in electrically conductive fashion. The connections K1 through Kn of the inductors L1 in driver circuit 200 or in the power module also have to be connected to one another in electrically conductive fashion, or, alternatively, per inductor L1 a switching means has to be provided for coupling the respective inductor L1 into or out of the respective source path of the respective power transistor 12. In addition, in this first circuit variant all inductors L1 have to be realized symmetrically in order to reduce oscillations of the overall circuit.

At right in FIG. 5, a second circuit configuration is shown that includes a common source feedback for all chips, or for all power transistors 12 realized on a respective chip. Thus, here only one inductor L1 is provided that is reversibly switchable into the source paths of all power transistors 12 in common. In this circuit variant, or circuit configuration, shown at right in FIG. 5 as well, the gate contacts of power transistors 12 in the power module and/or in driver circuit 200 have to be connected to one another in electrically conductive fashion. However, in this circuit variant only one switching means is sufficient to ensure the ability to switch in, or ability to couple out, the one common inductor L1.

Although the present invention has been illustrated and described in detail on the basis of preferred exemplary embodiments, the present invention is not thus limited by the disclosed examples, and other variations may be derived therefrom by a person skilled in the art without departing from the scope of the present invention.

What is claimed is:

1. A driver circuit for a low-inductance power module, comprising:
   a connection; and
   an output;
   wherein the connection is connectable to a source contact of a power transistor and the output is connectable to a gate contact of the power transistor, and the driver circuit is configured to produce, in a first operating mode, a first gate-source voltage for the gate contact of the power transistor and to provide the first gate-source voltage at the output of the driver circuit; and wherein the driver circuit is further configured to produce, in a second operating mode, during at least one preset minimum time span, a lower second gate-source voltage for the gate contact of the power transistor and to provide the second gate-source voltage at the output of the driver circuit, wherein the preset minimum time span corresponds to a time span that is required by a short circuit recognition circuit connected to the power transistor to recognize a short circuit when the power transistor is switched on and to initiate and/or carry out a switching off of the power transistor.

2. The driver circuit as recited in claim 1, wherein the driver circuit includes two different voltage sources by which the first gate-source voltage and the second gate-source voltage can be produced and can be provided at the output of the driver circuit.

3. The driver circuit as recited in claim 1, wherein connected between the output and the connection of the driver circuit is at least one voltage source by which a voltage can be applied to the output of the driver circuit, at least one inductor being reversibly switchable, by a switch, into an electrical path between the at least one voltage source and the connection.

4. The driver circuit as recited in claim 3, further comprising:
a further voltage source connected in series to the inductor, and being reversibly switchable, by the switch, together with the inductor, into the electrical path between the at least one voltage source and the connection.

5. The driver circuit as recited in claim 4, wherein: (i) at least one voltage source of the at least one voltage source of the driver circuit has a linear controller, and/or an RC voltage divider, and/or at least one bipolar transistor, and/or a bootstrap circuit, and/or (ii) at least one voltage source of the at least one voltage source of the driver circuit is realized using a bipolar transistor structure and/or a MOSFET structure.

6. The driver circuit as recited in claim 5, wherein the driver circuit is an ASIC or is formed by discrete components.

7. A driver circuit for a low-inductance power module, comprising:
a connection; and
an output;
wherein the connection is connectable to a source contact of a power transistor and the output is connectable to a gate contact of the power transistor, and the driver circuit is configured to produce, in a first operating mode, a first gate-source voltage for the gate contact of the power transistor and to provide the first gate-source voltage at the output of the driver circuit; and
wherein the driver circuit is further configured to produce, in a second operating mode, during at least one preset minimum time span, a lower second gate-source voltage for the gate contact of the power transistor and to provide the second gate-source voltage at the output of the driver circuit, wherein the driver circuit includes two different voltage sources by which the first gate-source voltage and the second gate-source voltage can be produced and can be provided at the output of the driver circuit, wherein the two different voltage sources each has an input connected to the connection of the driver circuit, and each has a voltage output, an voltage output of a first voltage source of the two different voltage sources being connected to the output of the driver circuit via a series circuit of a first diode and a first resistor, and an voltage output of a second voltage source of the two different voltage sources is connected to the output of the driver circuit via a parallel circuit of two paths, a diode and/or a resistor being provided in each of the paths.

8. The driver circuit as recited in claim 7, further comprising:
a control circuit configured to operate the two different voltage sources corresponding to a predetermined algorithm.

9. A low-inductance power module, comprising:
a driver circuit for a low-inductance power module, including:
a connection; and
an output;
wherein the connection is connectable to a source contact of a power transistor and the output is connectable to a gate contact of the power transistor, and the driver circuit is configured to produce, in a first operating mode, a first gate-source voltage for the gate contact of the power transistor and to provide the first gate-source voltage at the output of the driver circuit; and
wherein the driver circuit is further configured to produce, in a second operating mode, during at least one preset minimum time span, a lower second gate-source voltage for the gate contact of the power transistor and to provide the second gate-source voltage at the output of the driver circuit; and
the power transistor having the source contact and the gate contact, the source contact being connected to the connection of the driver circuit and the gate contact being connected to the output of the driver circuit,
wherein the preset minimum time span corresponds to a time span that is required by a short circuit recognition circuit connected to the power transistor to recognize a short circuit when the power transistor is switched on and to initiate and/or carry out a switching off of the power transistor.

10. The low-inductance power module as recited in claim 9, wherein the power transistor is a silicon carbide MOSFET.

* * * * *